(12) United States Patent
Wang et al.

(10) Patent No.: US 8,828,632 B2
(45) Date of Patent: *Sep. 9, 2014

(54) MULTIPLE-GRID EXPOSURE METHOD

(71) Applicant: Taiwan Semiconductor Manufacturing Company, Ltd., Hsinchu (TW)

(72) Inventors: Wen-Chuan Wang, Hsinchu (TW); Shy-Jay Lin, Jhudong Township (TW); Pei-Yi Liu, Changhua (TW); Jaw-Jung Shin, Hsinchu (TW); Burn Jeng Lin, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/017,749

(22) Filed: Sep. 4, 2013

(65) Prior Publication Data

US 2014/0004468 A1    Jan. 2, 2014

Related U.S. Application Data

(63) Continuation of application No. 13/368,877, filed on Feb. 8, 2012, now Pat. No. 8,530,121.

(51) Int. Cl.
*G03F 9/00* (2006.01)
*G03F 7/20* (2006.01)

(52) U.S. Cl.
CPC ............... *G03F 7/2022* (2013.01); *G03F 7/20* (2013.01); *Y10S 430/143* (2013.01)
USPC ............... 430/22; 430/30; 430/296; 430/394; 430/942

(58) Field of Classification Search
CPC ... G03F 7/2037; G03F 7/2051; G03F 7/2059; G03F 7/70358; G03F 7/704; G03F 9/7003
USPC .............................. 430/22, 30, 296, 394, 942
See application file for complete search history.

(56) References Cited

U.S. PATENT DOCUMENTS 8,510,687 B1    8/2013   Liu et al.
8,530,121 B2 *  9/2013   Wang et al. .................... 430/22

OTHER PUBLICATIONS

Unpublished U.S. Appl. No. 13/409,653 entitled "Non-Directional Dithering Methods", filed Mar. 1, 2012, 19 pgs.

\* cited by examiner

*Primary Examiner* — Christopher Young
(74) *Attorney, Agent, or Firm* — Haynes and Boone, LLP

(57) ABSTRACT

A method for fabricating a semiconductor device is disclosed. An exemplary method includes receiving an integrated circuit (IC) layout design including a target pattern on a grid. The method further includes receiving a multiple-grid structure. The multiple-grid structure includes a number of exposure grid segments offset one from the other by an offset amount in a first direction. The method further includes performing a multiple-grid exposure to expose the target pattern on a substrate and thereby form a circuit feature pattern on the substrate. Performing the multiple-grid exposure includes scanning the substrate with the multiple-grid structure in a second direction such that a sub-pixel shift of the exposed target pattern occurs in the first direction, and using a delta time ($\Delta t$) such that a sub-pixel shift of the exposed target pattern occurs in the second direction.

20 Claims, 9 Drawing Sheets

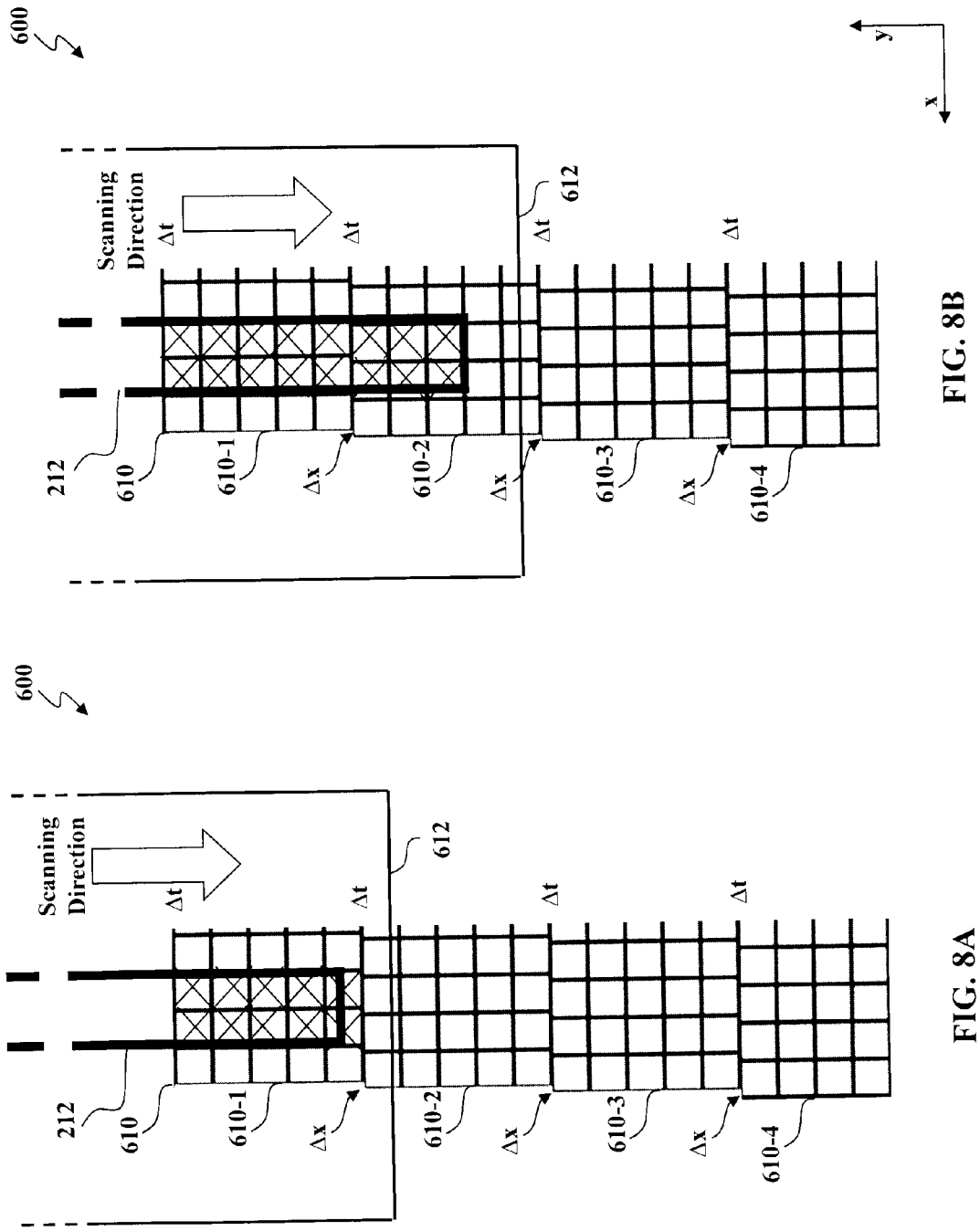

content continues …

MULTIPLE-GRID EXPOSURE METHOD

CROSS REFERENCE

This application is a continuation of U.S. patent application Ser. No. 13/368,877, filed on Feb. 8, 2012, entitled "A Multiple-Grid Exposure Method," issued as U.S. Pat. No. 8,530,121, the entire disclosure of which is incorporated herein by reference.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, stricter demands have been placed on lithography process. For example, techniques such as immersion lithography, multiple patterning, extreme ultraviolet (EUV) lithography, and e-beam lithography have been utilized to support critical dimension (CD) requirements of the smaller devices. Such lithography methods, however, may result in truncation error which adversely effects the CD required for the smaller devices. Certain compensation methods, such as increasing the number of pixels in an exposure grid and pre-exposure data preparation/computation, have been used to minimize the truncation error. These compensation methods, however, increase manufacturing time and cost. Accordingly, although existing lithography methods have been generally adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8A to 8D illustrate a top view of performing a multiple-grid exposure, according to the method of FIG. 1.

DETAILED DESCRIPTION

Figure 1:
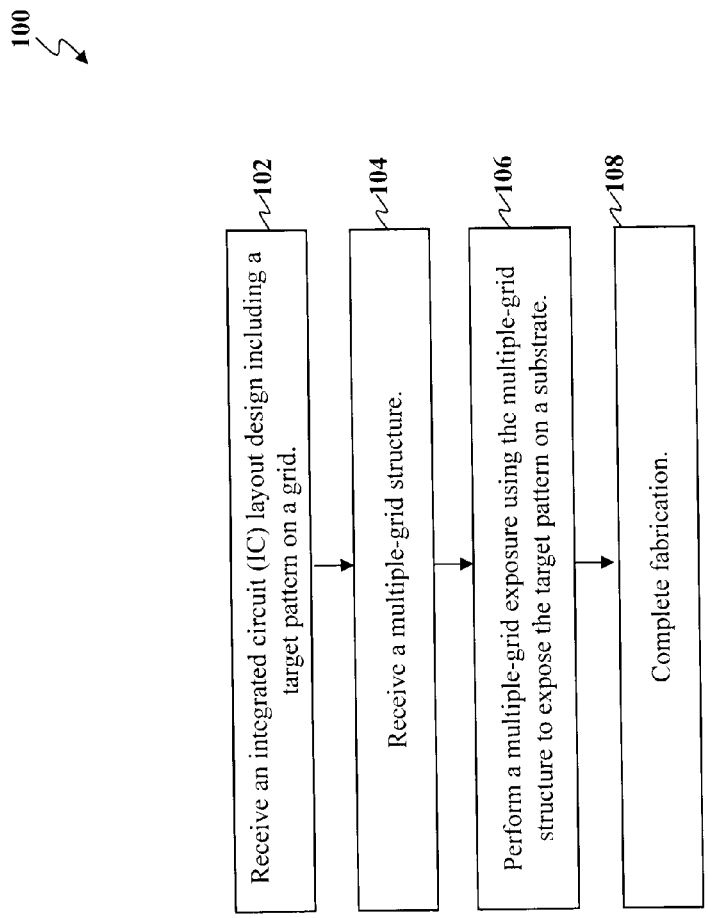
FIG. 1 is a flowchart illustrating a method of a multiple-grid exposure method, according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

As semiconductor fabrication technologies continue to evolve, lithography processes have been utilized to achieve increasing functional densities and decreasing device sizes. One form of lithography is electron beam (e-beam) lithography. In e-beam lithography, an e-beam apparatus emits beams of electrons in a patterned manner across a surface of a substrate covered with a resist film. This process may be referred to as an exposure process. A developing process is subsequently utilized to selectively remove either exposed regions or non-exposed regions of the resist film. The developing of the resist film results in a patterned resist film, which may be used as a patterned mask to pattern the substrate (or other layers of the substrate) in subsequent fabrication processes.

With reference to FIGS. 1 to 8, a method 100 is described below. FIG. 1 is a flowchart illustrating a multiple-grid exposure method, according to various aspects of the present disclosure. The method 100 begins at block 102 where an integrated circuit (IC) layout design including a target pattern on a grid is received. At block 104, a multiple-grid structure is received. The multiple-grid structure may include any number of exposure grid segments. For example, in the present embodiment, the multiple-grid structure includes a first, second, third, and fourth exposure grid segment. At block 106, a multiple-grid exposure is performed to expose the target pattern on a substrate. The multiple-grid exposure may include a lithography process that uses the multiple-grid exposure structure to scan across the substrate such that the target pattern is exposed on the substrate. Further, the multiple-grid exposure includes delaying the exposure in the scanning direction for a predetermined period of time. At block 110, fabrication is completed. It is understood that the method 100 may include forming any number (e.g., n-number) of patterns of various uniform and uniform sizes/shapes in a single-scan or multiple-scan process. Additional steps can be provided before, during, and after the method 100, and some of the steps described can be replaced or eliminated for other embodiments of the method. The discussion that follows illustrates an embodiment of a multiple-grid exposure process, according to the method 100 of FIG. 1.

Figure 2:
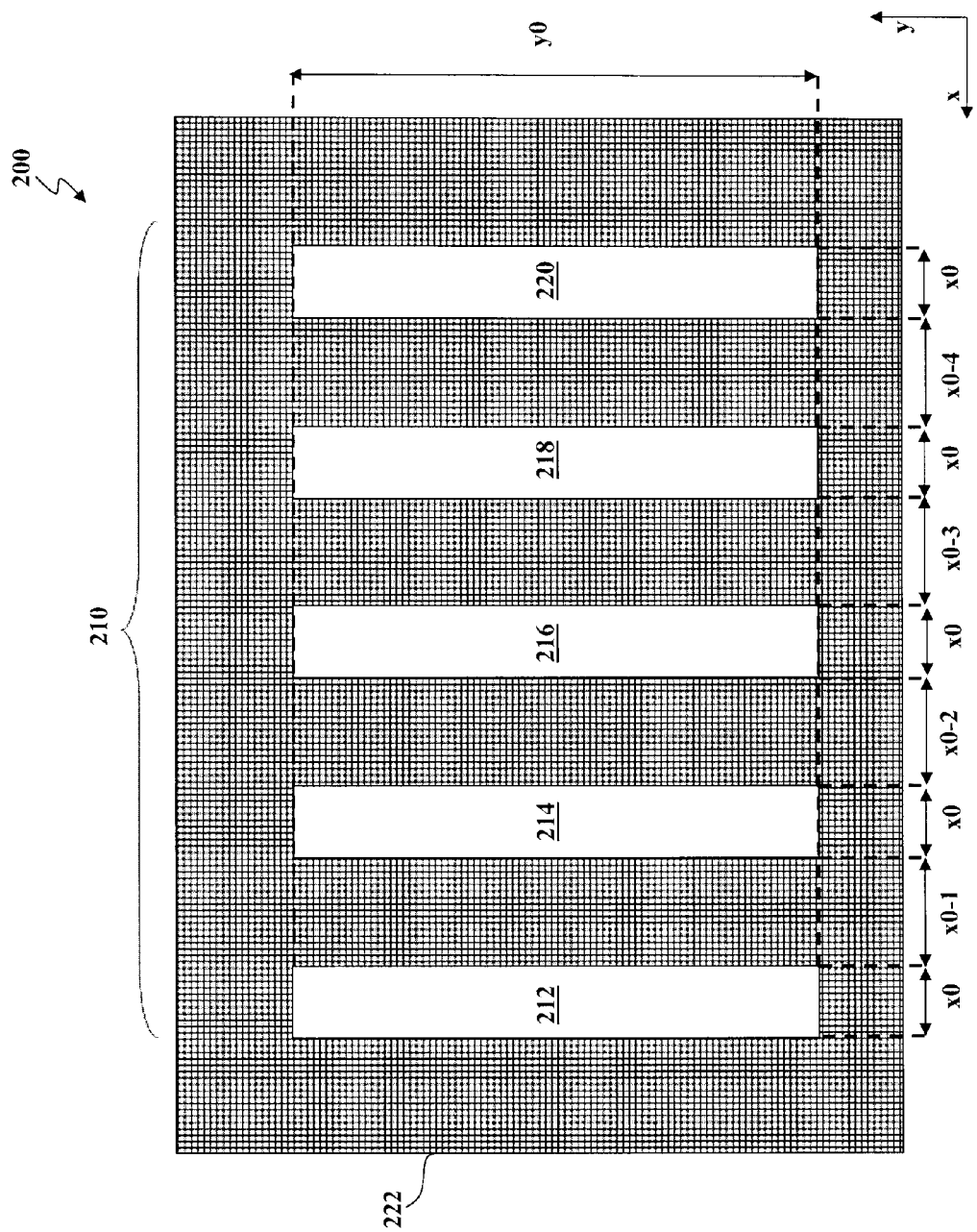
FIG. 2 illustrates a top view of an GDS IC layout design including a target pattern, according to various aspects of the present disclosure.

FIG. 2 illustrates a top view of an integrated circuit (IC) layout design 200 including a target pattern 210, according to various aspects of the present disclosure. The target pattern 210 defines semiconductor circuit features each having target circuit patterns 212, 214, 216, 218, and 220. The IC layout design 200 may be generated as a computer file, for example, as a graphic database system (GDS) type file, as an open artwork system interchange standard (OASIS) type file, or as any appropriate type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools.

As noted above, the target pattern 210 defines semiconductor circuit features. The semiconductor circuit features defined by the target pattern 210 may include features of a verity of devices, for example, passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), fin-like field effect transistors (FINFETs), high voltage transistors, and/or high frequency transistors; other suitable components.

Still referring to FIG. 2, by way of example and not limitation, a simplified IC layout design 200 is illustrated. The IC layout design 200 includes a target pattern 210 including a plurality of target circuit patterns 212, 214, 216, 218, and 220 having a polygon shape on a grid 222. The target circuit patterns 212, 214, 216, 218, and 220 have a y0 height, a x0 width, and are spaced apart by x0-1 to x0-4 distances. In the illustrated embodiment, target circuit patterns 212, 214, 216, 218, and 220 each have the same height y0 and the same width x0. In alternative embodiments, they have different heights and widths. Further, in the illustrated embodiment, each target circuit pattern 212, 214, 216, 218, and 220 is equally spaced apart one from the other. In other words, distance x0-1, x0-2, x0-3, and x0-4, are equal. Although in the illustrated embodiment a plurality of similar target circuit patterns are shown, the target pattern may provide for different target circuit patterns and each being of varying sizes and being varying distances one from the other. The sizes may refer to physical dimensions of the target circuit patterns or the amount of data associated with each target circuit pattern within the IC layout design 200.

The grid 222 includes a two-dimensional (2D) array of pixels arranged in a grid pattern having rows and columns. The grid 222 may be a GDS grid. Each pixel of the 2D array of pixels has a size (e.g., area) determined by the pixel length and width. Each pixel of the 2D array of pixels may be the same size. A pixel size (e.g., area) of the grid 222 is selected such that boundaries of the target pattern 210 substantially align within boundaries of pixels of the grid 222, as illustrated. Pixels are often represented using dots or squares in a coordinate system. Each pixel has an exposure intensity value (represented by a digital number) and a location address (corresponding to its coordinates). Pixels in the grid 222 are divided to two types—interior and exterior of the target pattern 210. For an interior pixel (or an exterior pixel, vice versa), a lithography exposure dose is set at maximum intensity (or at minimum intensity. vice versa), which is referred to as a black color or a white color, respectively.

Figure 3:
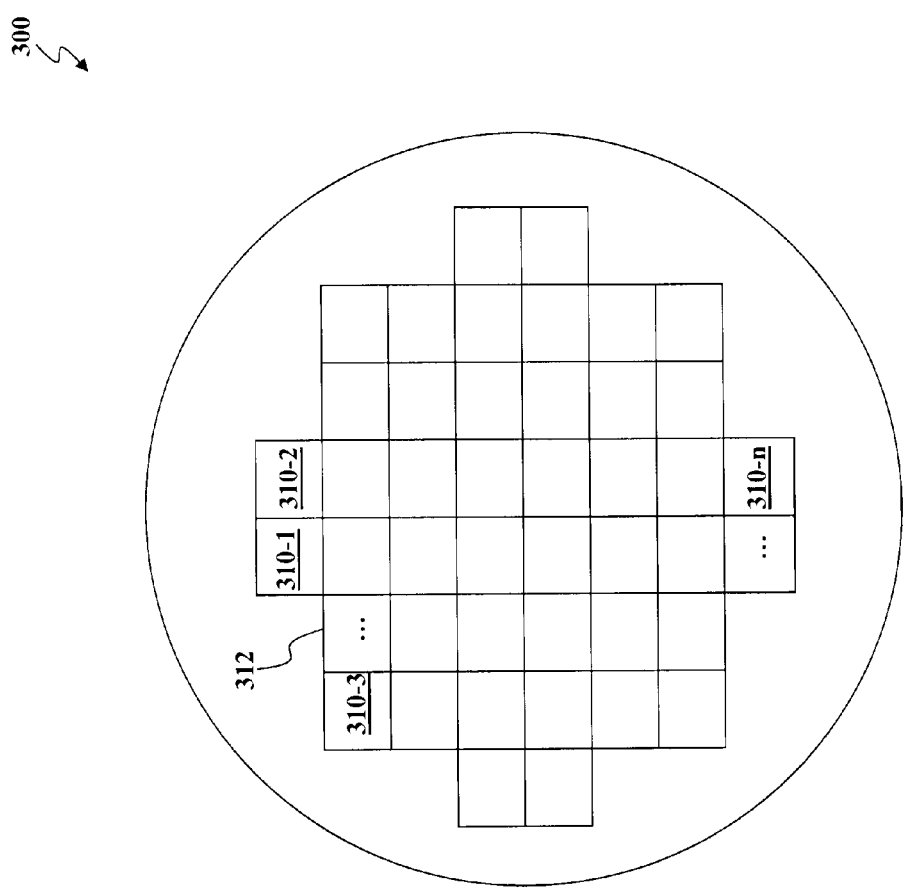
FIG. 3 illustrates a top view of a wafer that the target pattern of FIG. 2 may be patterned onto, according to various embodiments of the present disclosure.

FIG. 3 illustrates a top view of a wafer 300 that the target pattern 210 (of FIG. 2) may be patterned onto, according to various embodiments of the present disclosure. The wafer 300 includes a substrate (e.g., a semiconductor substrate), a mask (photomask or reticle, collectively referred to as mask), or any base material on which processing is conducted to produce layers of material, pattern features, and/or integrated circuits. For example, the wafer 300 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (501). In some examples, the semiconductor substrate may include a doped epi layer. In some examples, the silicon substrate may include a multilayer compound semiconductor structure. Alternatively, the wafer 200 may include a non-semiconductor material, such as a glass substrate for thin-film-transistor liquid crystal display (TFT-LCD) devices, or fused quartz or calcium fluoride for a photomask (mask).

Still referring to FIG. 3, the wafer 300 is divided into exposure fields 310-1, 310-2, 310-3, . . . , and 310-$n$. The fields 310 are separated or defined by scribe lines (or lanes) 312. In the present embodiment, the scribe lines 312 are configured between each field 310 to identify a perimeter of each field 310. An exposure field includes an area of a substrate exposed by an exposure process (e.g., optical exposure, or electron beam (e-beam) exposure). So, when the wafer 300 is subjected to a lithography process, an exposure process may be used to transfer a pattern to the substrate of each field (i.e., 310-1, 310-2, 310-3, . . . 310-$n$) to form integrated circuits onto the substrates within each field 310.

Figure 4:
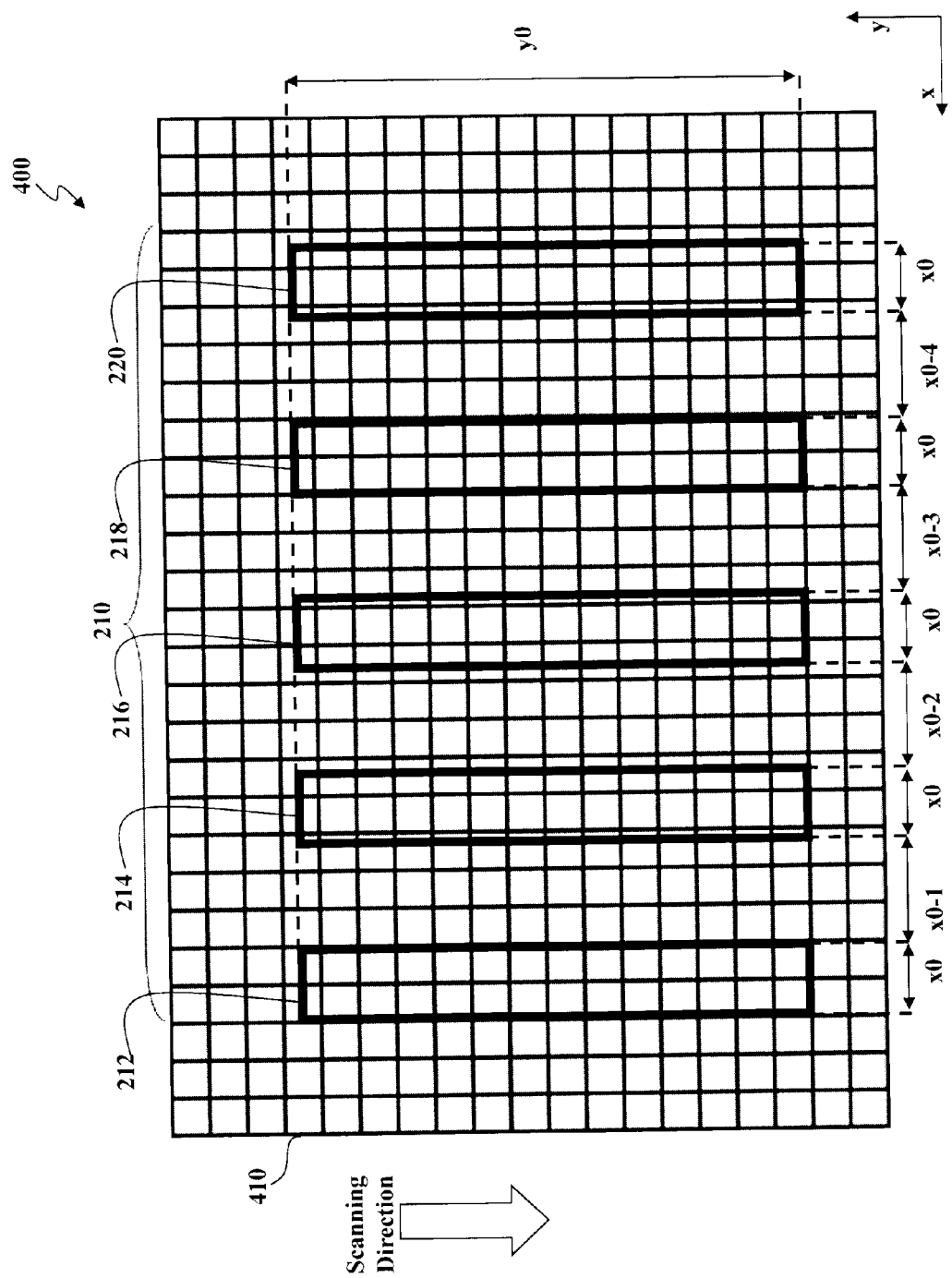
FIG. 4 illustrates a top view of an exposure layout including an exposure grid, according to various aspects of the present disclosure.

FIG. 4 illustrates a top view of an exposure layout, according to various aspects of the present disclosure. Referring to FIG. 4, the exposure layout 400 includes the target pattern 210 including the plurality of target circuit patterns 212, 214, 216, 218, and 220. The exposure layout 400 further includes an exposure grid 410. The exposure grid 410 exposes the target pattern 210 (including the plurality of target circuit patterns 212, 214, 216, 218, and 220) on the substrate of wafer 300 using a lithography exposure process that scans in the y-direction over the substrate, thereby forming a circuit feature pattern on the substrate underlying the exposure grid 410.

The exposure grid 410 includes a two-dimensional (2D) array of pixels arranged in a grid pattern having rows and columns. Each pixel of the 2D array of pixels has a size (e.g., area) determined by its length and width. The pixels of the exposure grid 410 are larger than the pixels of the grid 222 of the IC layout design 200. Pixels are often represented using dots or squares. Each pixel has an exposure intensity value (represented by a digital number) and a location address (corresponding to its coordinates). A lithography exposure process scans across the surface of a substrate to be patterned, pixel by pixel (or pixels by pixels). Notably, due to manufacturing constraints, the pixel size of the exposure grid 410 is typically substantially larger than the pixel size of the grid 222 of the IC layout design 200, thereby gaining process throughput as scanning time is minimized. For example, a pixel size of the grid 222 may range from about 0.1 nm to about 0.5 nm and a pixel size of the exposure grid 410 may range from about 1 nm to about 5 nm. It is understood that the pixels can be any size (per design requirements) and the ranges provided herein are merely exemplary and not limiting, unless claimed. Because the pixel size of the exposure grid 410 is significantly larger than the pixel size of the grid 222 of the IC layout design 200, the boundaries of the target pattern 210 of the IC layout design 200 may not match with the boundaries of pixels in some locations of the exposure grid 410. The mismatch generates partial filled pixels in the exposure grid 410, referred to as pixel truncations.

Pixel truncations may be under-inclusive or over-inclusive. In other words, pixel truncation may occur if a pixel is not written to because a threshold value of coverage area is not satisfied, thereby resulting in under-inclusive truncation. On the other hand, pixel truncation may occur if a pixel is written to because the threshold value of coverage is satisfied, thereby resulting in over-inclusive truncation. For example, the threshold value may be a 50% value such that if more than 50% of a pixel area of a pixel of the exposure grid 410 is covered by the target pattern then that pixel is included and exposed during the scanning and if less than 50% of a pixel area of a pixel of the exposure grid 410 is not covered by the target patter then that pixel is not included and not exposed during scanning. It is understood that the threshold value may be represented by any value and/or equation according to design requirements, As will be further described below, pixel truncations results in critical dimension (CD) error and center of mass (CM) deviation error.

Figure 5:
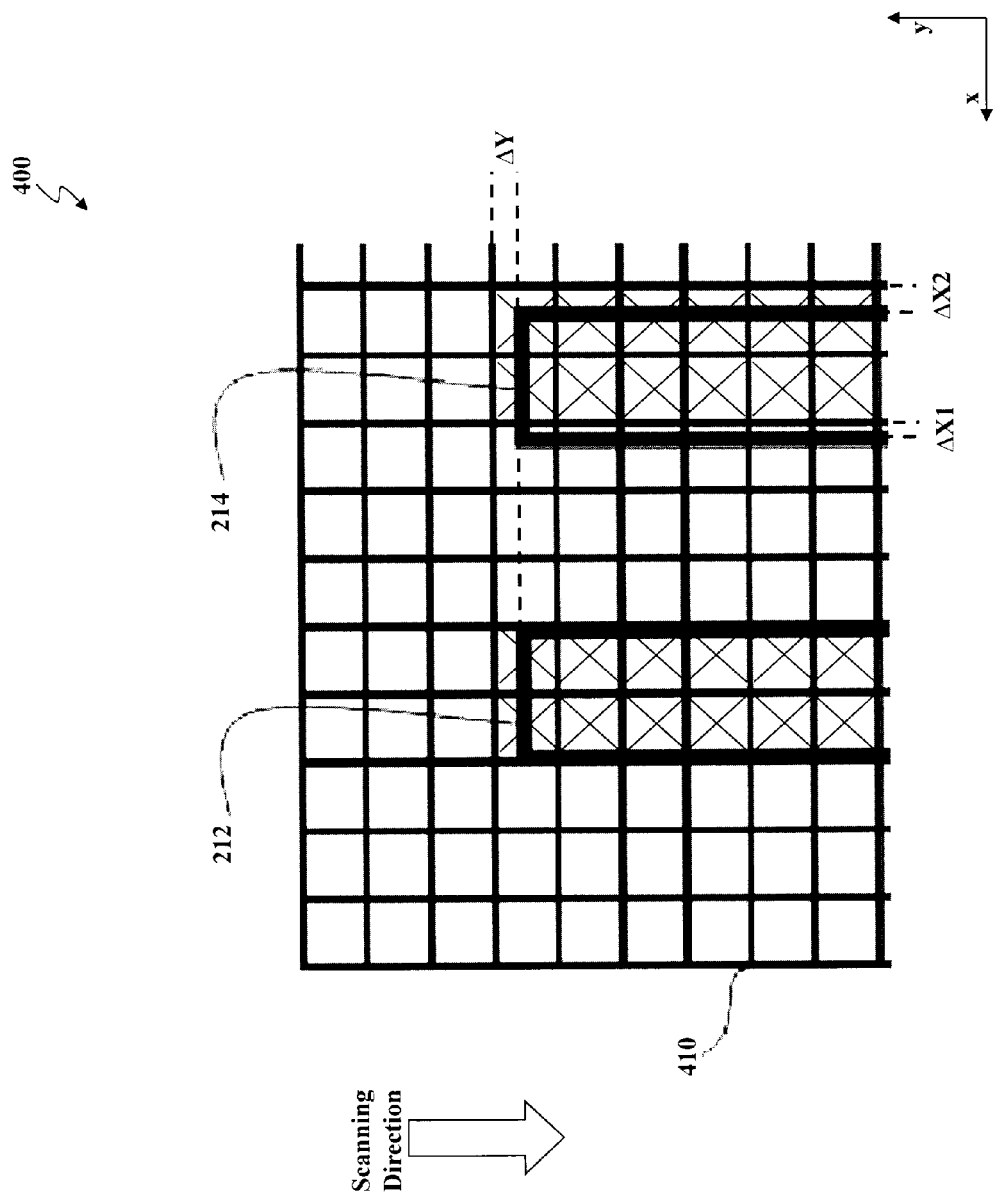
FIG. 5 illustrates a partial top view of the exposure layout of FIG. 4, according to various aspects of the present disclosure.

FIG. 5 illustrates a partial top view of the exposure layout 400 including the exposure grid 410 of FIG. 4, according to various aspects of the present disclosure. Pixel truncation is denoted in the y direct by ΔY, while pixel truncation is denoted in the x-direction by ΔX. The pixels which are active and thus expose the underlying substrate are denoted by "X". In the illustrated embodiment, target circuit pattern 212 does not experience x-direction truncation as the target circuit pattern 212 fits directly within the pixels of the exposure grid 410 in the x-direction. Target circuit pattern 212, however, does experience ΔY pixel truncation (over-inclusive) in the y-direction as the top portion of the target circuit pattern 212 does not fit within the pixels of the exposure grid 410 in the y-direction and the target pattern 212 coverage area is greater than a threshold value of 50%. The over-inclusion results in a CD error as the whole target circuit pattern 212 is extended upward during the scanning exposure. Target circuit pattern 214 experiences ΔX1 pixel truncation (under-inclusive) in the x-direction as the target circuit pattern 214 does not fit directly within the pixels of the exposure grid 410 in the x-direction and the target pattern 214 coverage area is less than a threshold value of 50%. Further, target circuit pattern 214 experiences ΔX2 pixel truncation (over-inclusive) truncation in the x-direction as the target circuit pattern 214 does not fit directly within the pixels of the exposure grid 410 in the x-direction and the target pattern 214 coverage area is greater than a threshold value of 50%. The under/over inclusive combination results in a CM deviation error as the whole target circuit pattern 214 is shifted to the right in the x-direction upon exposure. Target circuit pattern 214 experiences ΔY pixel truncation (over-inclusive) in the y-direction as the top portion of the target circuit pattern 214 does not fit within the pixels of the exposure grid 410 in the y-direction and is greater than a threshold value of 50%. The over-inclusion in the y-direction results in a CD error in the y-direction as the whole target circuit pattern 214 is extended upward. Accordingly, the target pattern 210 experiences CD error and CM deviation error due to under-inclusion and/or over-inclusion truncation error.

Figure 6:
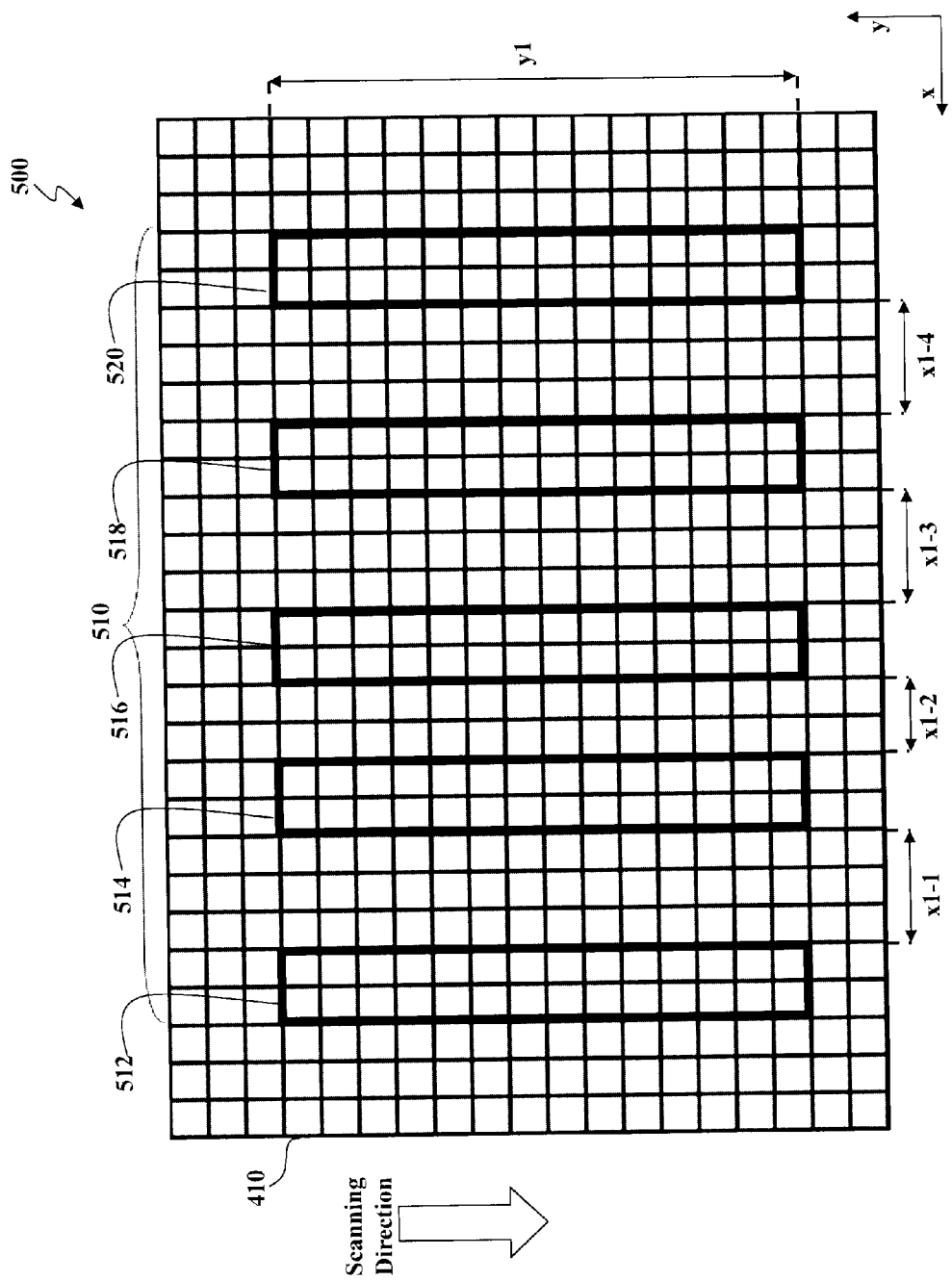
FIG. 6 illustrates a top view of the exposure layout of FIG. 4, according to various embodiments of the present disclosure.

FIG. 6 illustrates a top view of a resulting exposure, according to various embodiments of the present disclosure. Referring to FIG. 6, after exposing the target pattern (item 210 of FIG. 4) on the substrate underlying the exposure grid 410, feature pattern 510 is formed on the substrate in the post exposure layout 500. Formed feature pattern 510 includes a plurality of formed circuit feature patterns 512, 514, 516, 518, and 520. As illustrated, the formed circuit feature patterns 512, 514, 516, 518, and 520 of the formed feature pattern 510 of the post exposure layout 500 experience CD error and/or CM deviation error. For example, CD error is experienced by each circuit feature 512, 514, 516, 518, and 520 in the y-direction as the formed feature pattern 510 has been extended in the y-direction (compare y1 of FIG. 6 and y0 of FIG. 4). Further certain formed circuit feature patterns of the formed feature pattern 510 experience CM deviation error in the x-direction. For example, formed circuit feature 514 experiences a CM deviation error in the x-direction (compare x1-1 of FIG. 6 and x0-1 of FIG. 4; compare and x1-2 of FIG. 6 and x0-2 of FIG. 4). CD/CM errors are also experienced by other formed feature patterns as illustrated. It is understood that although in the present embodiment a CD error in the x-direction has not been illustrated, CD error in the x-direction may occur depending on pixel truncation occurrence. Further, it is understood that because CD/CM errors (which result from truncation errors) are not only a function of pixel size but also a function of pixel intensity, exposure simulation may be necessary to determine the resulting CD/CM errors.

Figure 7:
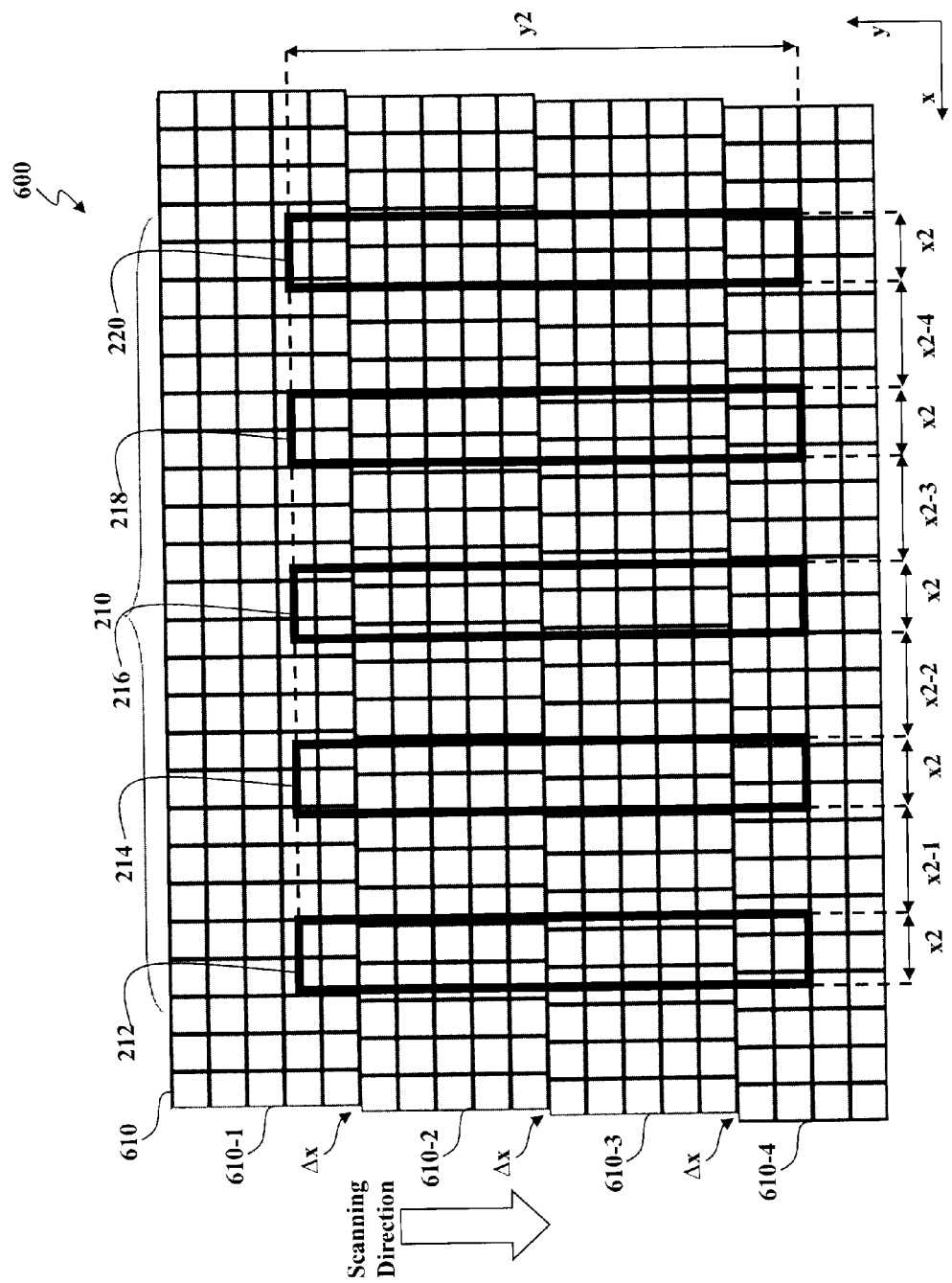
FIG. 7 illustrates a top view of an exposure layout including multiple-grid structures, according to various embodiments of the present disclosure.

FIG. 7 illustrates a top view of an exposure layout including a multiple-grid structure, according to various embodiments of the present disclosure. Referring to FIG. 7, exposure layout 600 includes a multiple-grid structure 610 (including exposure grid segments 610-1, 610-2, 610-3, and 610-4). The exposure grid segments 610-1, 610-2, 610-3, and 610-4 of the multiple-grid structure 610 are offset one to another in the x-direction by an offset amount Δx. The offset amount Δx may be calculated such that each segment may be equally offset one from the other in the x-direction. For example, the illustrated embodiment shows a multiple-grid structure 610 including 4 exposure grid segments. As such, the designed offset amount Δx of each exposure grid segment 610-1, 610-2, 610-3, and 610-4 in the x-direction is calculated such that each pixel of the multiple-grid structure 610 is equally offset (e.g., each exposure grid segment 610-1, 610-2, 610-3, and 610-4 is offset by ¼ of a pixel width). In other words, the offset amount Δx is calculated such that the offset amount Δx multiplied by the number of exposure grid segments (e.g., 4) equals to the width of one pixel. Although only 4 exposure grid segments are illustrated, it is understood that any number of exposure grid segments may be utilized, according to design requirements. It is further understood that the exposure grid segments need not necessarily be equally offset one to the other.

Still referring to FIG. 7, The exposure layout 600 further includes target pattern 210 (from design layout 200 of FIG. 2) including the plurality of target circuit patterns 212, 214, 216, 218, and 220. As the target pattern 210 is used in a lithography exposure process by scanning in the y-direction, a circuit feature pattern is formed on the wafer including the substrate underlying the multiple-grid structure 610. Notably, the scanning process exposes the target circuit pattern 212, 214, 216,

218, and 220 to each exposure grid segment 610-1, 610-2, 610-3, and 610-4 of the multiple-grid structure 610, thereby providing for an average exposure that allows the CD error and CM deviation error to be minimized or even eliminated (depending on the number of exposure grid segments).

Figure 8D:
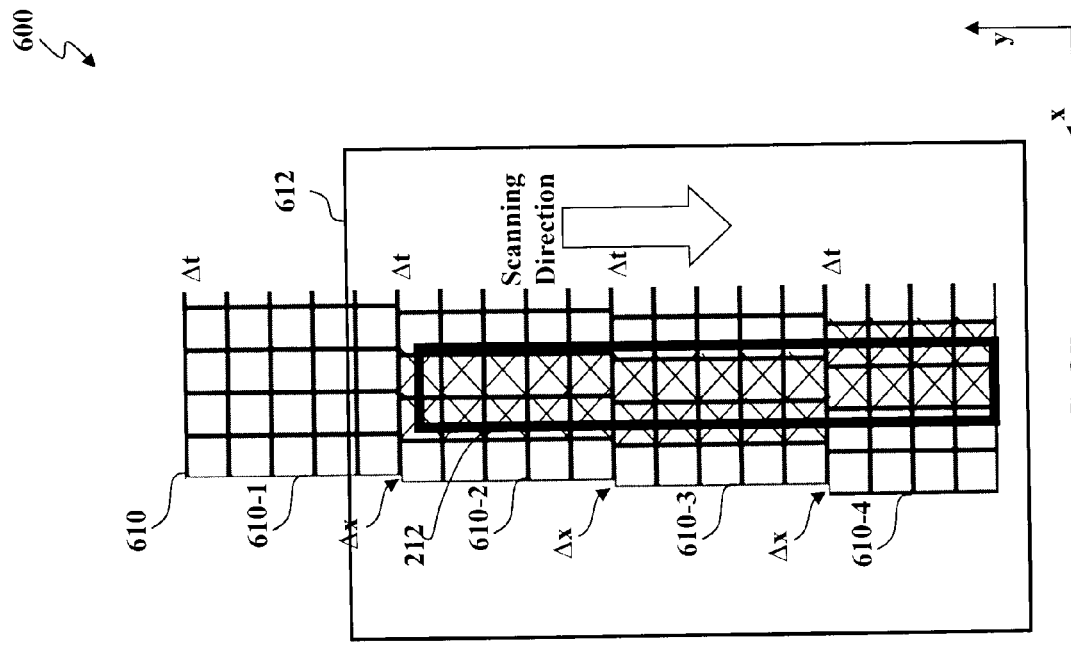

FIGS. 8A-8D illustrate a top view of an example of performing a multiple-grid exposure, according to the method of FIG. 1. For simplicity, only the exposure of one target circuit pattern 212 is illustrated. It is understood that other target circuit patterns (e.g., 214, 216, 218, and 220) may be exposed simultaneously or in sequence according to the method disclosed herein. Referring to FIG. 8A, a multiple-grid structure 610 is provided. The multiple-grid structure 610 is similar to the multiple-grid structure 610 of FIG. 6. As the scanning process beings, each of the exposure grid segments is scanned across the underlying substrate 612 at a scanning speed ($V_s$) determined by design requirements. The scanning is in the y-direction and is a relative movement between the underlying substrate 612 and the multiple-grid structure 610 (including exposure grid segments 610-1, 610-2, 610-3, and 610-4). The exposure is a lithography exposure process (e.g., e-beam) that patterns the target pattern 212 on the substrate 612.

Still referring to FIG. 8A, the exposure grid segment 610-1 is scanned over the substrate 612 such that the target circuit pattern 212 is exposed on the underlying substrate 612. To limit exposure error in the y-direction during scanning, the scanning process provides for a sub-pixel shift of a delta time ($\Delta t$), which may be a constant value that is dependent on the $V_s$ (scanning speed) and the number of exposure grid segments. The $\Delta t$ may be used to delay the exposure of a pixel in the y direction for a fraction of the time required to scan the substrate across a pixel of the exposure grid, thereby obtaining a $\Delta y$ sub-pixel offset in the y direction corresponding to the $V_s$ and the $\Delta t$ (e.g., $\Delta y = V_s * \Delta t$, where $V_s$ is the scanning speed and $\Delta t$ is the time delay). In other words, performing the exposure process includes delaying exposing the target pattern 212 on the underlying substrate 612 by $\Delta t$, where $\Delta t$ is a fraction of time required to scan across a single pixel of the pixels of each of the exposure grid segments (e.g., 610-1, 610-2, 610-3, and 610-n). For example, if it takes 1 second to scan the substrate across a pixel and there are four exposure grid segments (e.g., 610-1, 610-2, 610-3, and 610-4), then $\Delta t$ may be a constant equal to ¼ seconds, thereby providing for a sub-pixel shift of $\Delta y$ in the y-direction per exposure grid segment. In this example, the $\Delta t$ is applied independently to each exposure grid segment. It is understood, however, that any number of exposure grid segments and $\Delta t$ values may be provided for to produce a $\Delta y$ sub-pixel shift, depending on scanning/exposure speed $V_s$ and design requirements.

Referring to FIG. 8B, as the scanning continues, the grid exposure segment 610-2 exposes (denoted by X) the target circuit pattern 212 onto the underling substrate 612. Also, exposure grid segment 610-1 continues to expose (denoted by X) other portions of the target circuit pattern 212 onto the underlying substrate 612. In other words, as the scanning continues exposure gird segment 610-1 and 610-2 overlay the substrate 612 at the same time and thereby allow the exposure gird segment 610-1 and 610-2 to expose the target circuit pattern 212 on the underlying substrate 612 at the same time. Further, the exposure grid segment 610-2 has a $\Delta y$ sub-pixel shift in the y-direction that corresponds to $\Delta t$.

Figure 8C:
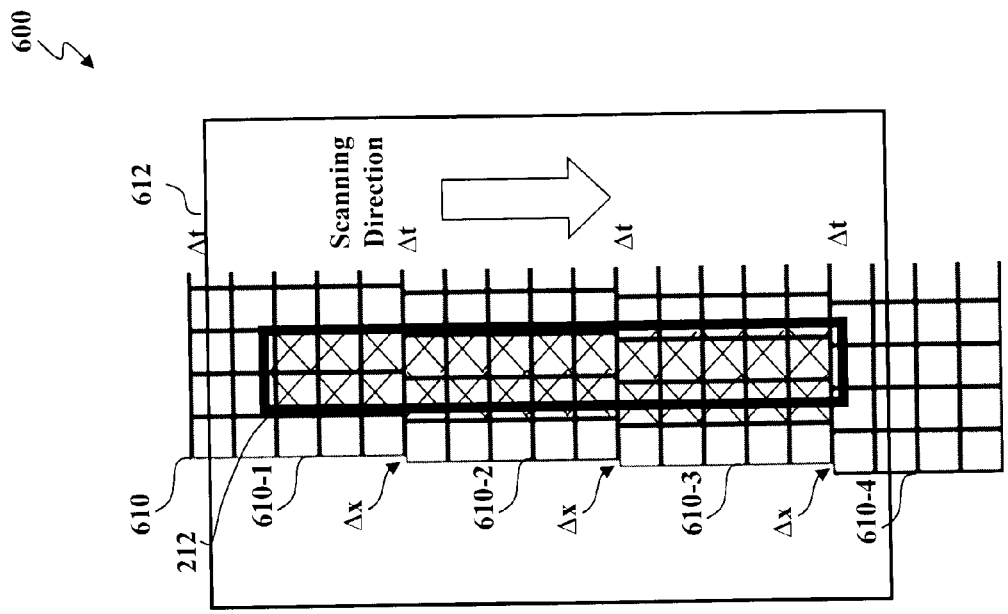

Referring to FIG. 8C, as the scanning continues, the exposure grid segment 610-3 exposes (denoted by X) the first portion of the target circuit pattern 212 onto the underling substrate 612. Also, exposure grid segments 610-1 and 610-2 continue to expose (denoted by X) other portions of the target circuit pattern 212 onto the underlying substrate 612. Further, the exposure grid segment 610-3 has a $\Delta y$ sub-pixel shift in the y-direction that corresponds to $\Delta t$.

Referring to FIG. 8D, as the scanning continues, the exposure grid segment 610-4 exposes (denoted by X) the first portion of the target circuit pattern 212 onto the underlying substrate 612. Further, the exposure grid segment 610-4 has a $\Delta y$ sub-pixel shift in the y-direction that corresponds to $\Delta t$. Also, exposure grid segments 610-2 and 610-3 continue to expose (denoted by X) other portions of the target circuit pattern 212 onto the underlying substrate 612. The target circuit pattern 212 is exposed onto the underlying substrate 612 by each exposure grid segment (610-1, 610-2, 610-3, and 610-4 of FIGS. 8A-8D) such that an average exposure results thereby forming a circuit feature pattern onto the substrate 612. Accordingly, the disclosed method allows for a single scan that provides a two-dimensional shift (i.e., $\Delta x$ and $\Delta y$). The $\Delta x$ shift per exposure grid is a function of the offset in the x direction of the multiple-grid structure and the $\Delta y$ shift per exposure grid is a function of the scanning speed $V_s$ and the time delay $\Delta t$ applied to each exposure grid of the multiple-grid structure.

A benefit of the method 100 disclosed herein is that a single-scan exposure can be performed with the multiple-grid structure in conjunction with a time delay $\Delta t$ at a scanning speed $V_s$ such that, for each exposure grid of the multiple-grid structure, a two-dimensional shift of $\Delta x$ and $\Delta y$ results, thereby reducing truncation error (depending on the pixel size of the multiple-grid structure). The reduced/eliminated pixel truncation serves to reduce CD error and the CM deviation error of the formed circuit pattern. Accordingly, the disclosed method allows for a reduction of CD and CM deviation errors thereby allowing for proper formation and alignment of target circuit patterns on a substrate and thus improving device performance/reliability. Furthermore, the disclosed method does not require additional/complicated upfront computations or increased pixel density (smaller pixel sizes increase the exposure time) to achieve the reduced CD/CM error. Thus, the method disclosed for achieving the reduction of CD/CM error, described herein, is easily implemented into current processing and provides for a cost effective approach. Different embodiments may have different advantages, and no particular advantage is necessarily required of any embodiment.

Thus, provided is a method. An exemplary method includes receiving an integrated circuit (IC) layout design including a target pattern on a grid. The method further includes receiving a multiple-grid structure, the multiple-grid structure including first and second exposure grid segments offset one from the other by an offset amount in a first direction. The method further includes performing a multiple-grid exposure to expose the target pattern onto a substrate and thereby form a circuit feature pattern on the substrate, wherein performing the multiple-grid exposure includes: scanning the first exposure grid segment across a surface of the substrate in a second direction and exposing the target pattern on the substrate during the scanning of the first exposure grid segment, the first direction and the second direction being orthogonal one to the other; and scanning the second exposure grid segment across the surface of the substrate in the second direction and exposing the target pattern on the substrate during the scanning of the second exposure grid segment, wherein exposing the target pattern on the substrate during the scanning of the second exposure grid segment is performed such that a sub-pixel shift of the exposed target pattern occurs in the first direction, wherein exposing the target pattern on the substrate during the scanning of the second exposure grid segment includes delaying the exposure for a delta time (Δt) such that a sub-pixel shift of the exposed target pattern occurs in the second direction.

In some embodiments, the grid of the IC layout design includes a first two-dimensional (2D) array of pixels, each pixel of the first 2D array of pixels having a first length and width, each pixel of the first 2D array of pixels having a first size being a function of the first length and width, the first and second exposure grid segments include a second two-dimensional (2D) array of pixels, each pixel of the second 2D array of pixels having a second length and width, each pixel of the second 2D array of pixels having a second size being a function of the second length and width, and the second size is greater than the first size. In various embodiments, the first size of each pixel of the first 2D array of pixels is configured such that boundaries of the target pattern substantially align within boundaries of pixels of the first 2D array of pixels. In certain embodiments, the offset amount is calculated such that the offset amount multiplied by the number of exposure grid segments equals to the second width. In further embodiment, the grid of the IC layout design is a graphic database system (GDS) grid. In some embodiments, the first and second exposure grid segments are equally offset one from the other. In various embodiments, exposing the target pattern on the substrate includes a lithography process. In further embodiments, the lithography process includes an electron beam (e-beam) process. In some embodiments, the target pattern includes a first target circuit pattern and a second target circuit pattern, wherein the first and second target circuit patterns are different, and wherein performing the multiple-grid exposure includes exposing the first and second target circuit patterns on the substrate in a single scan.

Also provided is an alternative embodiment of a method. The exemplary method includes scanning a substrate in a first direction such that a multiple-grid structure overlies the substrate. The multiple-grid structure includes first and second exposure grid segments. The first and second exposure grid segments include two-dimensional (2D) pixel arrays arranged in a grid pattern having columns and rows. The first exposure grid segment being offset from the second exposure grid segment in a second direction. The first and second directions being orthogonal one to the other. The method further includes exposing a target pattern on the substrate underlying the first exposure grid segment. The target pattern being defined on a grid of an integrated circuit (IC) layout design. The grid of the IC layout design including a 2D pixel array arranged in a grid pattern having columns and rows. The method further includes exposing the target pattern on the substrate underlying the second exposure grid segment such that a sub-pixel shift of the exposed target pattern occurs in the second direction and delaying the exposure of the target pattern on the substrate underlying the second exposure grid segment by a delta time (Δt) such that a sub-pixel shift of the exposed target pattern occurs in the first direction.

In some embodiments, the offset is calculated such that the offset multiplied by the number of exposure grid segments equals to a width of a pixel of the 2D pixel arrays. In certain embodiments, the scanning is performed at a scanning speed ($V_s$), and the sub-pixel shift in the first direction is a function of the Δt and the $V_s$. In various embodiments, exposing the target pattern on the substrate underlying the first and second exposure grid segments includes a lithography process. In some embodiments, the Δt and the $V_s$ are constants, and the sub-pixel shift in the first direction=$V_s$*Δt. In further embodiments, scanning the substrate includes scanning the substrate in the first direction such that the first exposure grid segment and the second exposure grid segment overlay the substrate at the same time and exposing the target pattern on the substrate underlying the first and second exposure grid segments includes exposing the target pattern on the substrate underlying the first and second exposure grid segments at the same time.

Also provided is yet another alternative method. The method includes receiving a multiple-grid structure including a plurality of exposure grid segments. Each of the plurality of exposure grid segments includes pixels of the same size arranged in a grid pattern. Each of the plurality of exposure grid segments is offset one from the other in a first direction by a fraction of a pixel width. The method further includes receiving a target pattern that defines a circuit feature of a semiconductor device. The method further includes, forming a circuit feature pattern defined by the target pattern on a substrate, wherein forming the circuit feature pattern includes: scanning the substrate in a second direction such that each of the plurality of exposure grid segments overlay the substrate at a point in time, wherein the second direction is orthogonal to the first direction; and performing a lithography process when each of the plurality of exposure grid segments overlays the substrate such that the target pattern is exposed on the underlying substrate thereby forming the circuit feature pattern on the underlying substrate, wherein for each of the plurality of exposure grid segments a sub-pixel shift of the formed circuit feature pattern occurs in the first direction, wherein performing the lithography process includes delaying exposing the target pattern on the underlying substrate by a delta time (Δt) such that a sub-pixel shift of the formed circuit feature pattern occurs in the second direction.

In some embodiments, the Δt is a fraction of time required to scan a pixel of the multiple-grid structure. In certain embodiments, the Δt is a function of the number of exposure grid segments of the plurality of exposure grid segments. In various embodiments, for each exposure grid segment of the plurality of exposure grid segments the Δt is applied independently. In further embodiments, scanning the substrate is performed at a scanning speed, and the Δt is a function of the scanning speed. In some embodiments, the scanning is performed at a scanning speed ($V_s$), the Δt and the $V_s$ are constants, and the sub-pixel shift in the second direction is a function of Δt and $V_s$. In some embodiments, the offset is calculated such that the offset multiplied by the number of exposure grid segments of the plurality of exposure grid segments equals to a width of a pixel of the plurality of exposure grid segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
receiving an integrated circuit (IC) layout design including a target pattern;
receiving a multiple-grid structure, the multiple-grid structure including first and second exposure grid segments offset one from the other by an offset amount in a first direction; and
performing a multiple-grid exposure including:
scanning the first exposure grid segment across a surface of a substrate in a second direction and exposing the target pattern on the substrate during the scanning of the first exposure grid segment; and scanning the second exposure grid segment across the surface of the substrate in the second direction and exposing the target pattern on the substrate during the scanning of the second exposure grid segment such that a sub-pixel shift of the exposed target pattern occurs in the first direction and a sub-pixel shift of the exposed target pattern occurs in the second direction.

2. The method of claim 1 wherein the sub-pixel shift of the exposed target pattern occurs in the second direction by delaying the exposure for a delta time ($\Delta t$).

3. The method of claim 1 wherein the first direction is orthogonal to the second direction.

4. The method of claim 1 wherein the target pattern of the IC layout is on a grid,
wherein the grid includes a first two-dimensional (2D) array of pixels, each pixel of the first 2D array of pixels having a first length and width, each pixel of the first 2D array of pixels having a first size being a function of the first length and width, and
wherein the first and second exposure grid segments include a second two-dimensional (2D) array of pixels, each pixel of the second 2D array of pixels having a second length and width, each pixel of the second 2D array of pixels having a second size being a function of the second length and width.

5. The method of claim 4, and wherein the second size is greater than the first size.

6. The method of claim 4 wherein the first size of each pixel of the first 2D array of pixels is configured such that boundaries of the target pattern substantially align within boundaries of pixels of the first 2D array of pixels.

7. The method of claim 4 wherein the multiple grid structure includes a number of exposure grid segments, and
wherein the offset amount is calculated such that the offset amount multiplied by the number of exposure grid segments equals to the second width.

8. The method of claim 1 wherein the first and second exposure grid segments are equally offset one from the other.

9. The method of claim 1 wherein the target pattern includes a first target circuit pattern and second target circuit pattern, the first target circuit pattern being different from the second target circuit pattern.

10. The method of claim 1 wherein performing the multiple-grid exposure includes exposing the first and second target circuit patterns on the substrate in a single scan.

11. A method comprising:
scanning a substrate in a first direction such that a multiple-grid structure overlies the substrate, the multiple-grid structure including first and second exposure grid segments, the first and second exposure grid segments including two-dimensional (2D) pixel arrays arranged in a grid pattern, the first exposure grid segment being offset from the second exposure grid segment in a second direction;
exposing a target pattern on the substrate underlying the first exposure grid segment; and
exposing the target pattern on the substrate underlying the second exposure grid segment such that a sub-pixel shift of the exposed target pattern occurs in the second direction.

12. The method of claim 11 wherein the target pattern is defined on a grid of an integrated circuit (IC) layout design, and
wherein the grid of the IC layout design includes a 2D pixel array arranged in a grid pattern.

13. The method of claim 12 wherein the grid pattern of the IC layout design 2D pixel array includes columns and rows.

14. The method of claim 11 wherein exposing the target pattern on the substrate underlying the second exposure grid segment includes delaying the exposure by a delta time ($\Delta t$) such that a sub-pixel shift of the exposed target pattern occurs in the first direction.

15. The method of claim 14 wherein the scanning is performed at a scanning speed ($V_s$), and
wherein the sub-pixel shift in the first direction is a function of the $\Delta t$ and the $V_s$.

16. The method of claim 14 wherein the $\Delta t$ and the $V_s$ are constants, and
wherein the sub-pixel shift in the first direction=$V_s * \Delta t$.

17. A method comprising:
receiving a multiple-grid structure including a plurality of exposure grid segments, wherein the plurality of exposure grid segments includes pixels arranged in a grid pattern, wherein a first exposure grid segment and a second exposure gird segment of the plurality of exposure grid segments are offset one from the other in a first direction by a fraction of a pixel width;
receiving a target pattern that defines a circuit feature;
forming a circuit feature pattern defined by the target pattern on a substrate, wherein forming the circuit feature pattern includes:
scanning the substrate in a second direction such that the first and second exposure grid segments overlay the substrate at a point in time; and
performing an exposure process during the scanning such that the target pattern is exposed on the underlying substrate thereby forming the circuit feature pattern on the underlying substrate,
wherein performing the exposure process includes delaying exposing the target pattern on the underlying substrate by a delta time ($\Delta t$) such that a sub-pixel shift of the formed circuit feature pattern occurs in the second direction.

18. The method of claim 17 wherein the $\Delta t$ is a fraction of time required to scan a pixel of the multiple-grid structure.

19. The method of claim 17 wherein the $\Delta t$ is a function of a total number of exposure grid segments of the plurality of exposure grid segments.

20. The method of claim 17 wherein for the first exposure grid segment and the second exposure grid segment the $\Delta t$ is applied independently during the lithography process.

* * * * *